(12) United States Patent
Nakajun et al.

(10) Patent No.: US 12,057,460 B2
(45) Date of Patent: Aug. 6, 2024

(54) IMAGING DEVICE

(71) Applicant: PANASONIC INTELLECTUAL PROPERTY MANAGEMENT CO., LTD., Osaka (JP)

(72) Inventors: Akio Nakajun, Osaka (JP); Shota Yamada, Shiga (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 15 days.

(21) Appl. No.: 18/101,834

(22) Filed: Jan. 26, 2023

(65) Prior Publication Data

US 2023/0170358 A1 Jun. 1, 2023

Related U.S. Application Data

(63) Continuation of application No. 17/077,013, filed on Oct. 22, 2020, now Pat. No. 11,594,562, which is a (Continued)

(30) Foreign Application Priority Data

Oct. 16, 2017 (JP) .................................. 2017-200556

(51) Int. Cl.
*H01L 27/146* (2006.01)
*H10K 30/80* (2023.01)

(52) U.S. Cl.
CPC .. *H01L 27/14603* (2013.01); *H01L 27/14605* (2013.01); *H01L 27/14627* (2013.01);
(Continued)

(58) Field of Classification Search
CPC ......... H01L 27/14625; H01L 27/14627; H01L 27/14645; H01L 27/14665;
(Continued)

(56) References Cited

U.S. PATENT DOCUMENTS

2010/0079637 A1 4/2010 Hwang
2011/0109776 A1 5/2011 Kawai
(Continued)

FOREIGN PATENT DOCUMENTS

CN 102097444 A 6/2011
CN 104067393 A 9/2014
(Continued)

OTHER PUBLICATIONS

English Translation of Chinese Search Report dated Jan. 18, 2023 for the related Chinese Patent Application No. 201811132204.5.
(Continued)

*Primary Examiner* — Laura M Menz
*Assistant Examiner* — Candice Chan
(74) *Attorney, Agent, or Firm* — Rimon P.C.

(57) ABSTRACT

An imaging device including: a semiconductor substrate having a first surface and a second surface opposite to the first surface; a microlens located closer to the first surface than to the second surface; and a first photoelectric converter located between the first surface and the microlens. The first photoelectric converter includes a first electrode, a second electrode, and a photoelectric conversion layer that is located between the first electrode and the second electrode and that converts light into electric charges. The first photoelectric converter is the closest of any photoelectric converter existing between the first surface and the microlens to the first surface. The imaging device includes no photodiode as a photoelectric converter, and a focal point of the microlens is located below a lowermost surface of the photoelectric conversion layer.

14 Claims, 13 Drawing Sheets

Related U.S. Application Data continuation of application No. 16/145,008, filed on Sep. 27, 2018, now Pat. No. 10,847,555.

(52) U.S. Cl.
CPC .. *H01L 27/14634* (2013.01); *H01L 27/14636* (2013.01); *H01L 27/14645* (2013.01); *H01L 27/14665* (2013.01); *H10K 30/80* (2023.02); *H01L 27/14621* (2013.01)

(58) Field of Classification Search
CPC ......... H01L 27/14603; H01L 27/14605; H01L 27/14634; H01L 27/14621; H10K 30/80
See application file for complete search history.

(56) References Cited

U.S. PATENT DOCUMENTS

| | | |
|---|---|---|
| 2011/0121371 A1 | 5/2011 | Sakano et al. |
| 2015/0028442 A1 | 1/2015 | Miyanami |
| 2015/0115339 A1 | 4/2015 | Tamaki et al. |
| 2015/0137199 A1 | 5/2015 | Mori et al. |
| 2015/0187826 A1 | 7/2015 | Suzuki |
| 2015/0195466 A1 | 7/2015 | Takase et al. |
| 2015/0349007 A1 | 12/2015 | Kato |
| 2017/0171458 A1 | 6/2017 | Hirota |
| 2017/0229503 A1 | 8/2017 | Suzuki et al. |
| 2018/0063410 A1 | 3/2018 | Izumi |

FOREIGN PATENT DOCUMENTS

| | | |
|---|---|---|
| CN | 107104117 A | 8/2017 |
| JP | 60-060757 | 4/1985 |
| JP | 5-048980 | 2/1993 |
| JP | 6-244394 | 9/1994 |
| JP | 10-070258 | 3/1998 |
| JP | 2004-335598 | 11/2004 |
| JP | 2010-087511 A | 4/2010 |
| JP | 2011-103335 | 5/2011 |
| JP | 2012-129276 A | 7/2012 |
| JP | 2014-130890 A | 7/2014 |
| JP | 2015-228468 A | 12/2015 |
| JP | 2016-192645 A | 11/2016 |
| WO | 2014/002332 A1 | 1/2014 |
| WO | 2014/002367 A1 | 1/2014 |
| WO | 2014/208047 A1 | 12/2014 |
| WO | 2016/013410 A1 | 1/2016 |
| WO | 2016/158618 A1 | 10/2016 |

OTHER PUBLICATIONS

Non-Final Office Aciton issued in U.S. Appl. No. 16/145,008, dated Oct. 4, 2019.

Final Office Aciton issued in U.S. Appl. No. 16/145,008, dated Apr. 6, 2020.

Notice of Allowance issued in U.S. Appl. No. 16/145,008, dated Jul. 27, 2020.

Notice of Allowance issued in U.S. Appl. No. 17/077,013, dated Nov. 18, 2022.

IMAGING DEVICE

CROSS-REFERENCE OF RELATED APPLICATIONS

This application is a Continuation of U.S. patent application Ser. No. 17/077,013, filed on Oct. 22, 2020, which is a Continuation of U.S. patent application Ser. No. 16/145,008, filed on Sep. 27, 2018, now U.S. Pat. No. 10,847,555, which claims the benefit of Japanese Application No. 2017-200556, filed on Oct. 16, 2017, the entire disclosures of which Applications are incorporated by reference herein.

BACKGROUND

1. Technical Field

The present disclosure relates to stacked type imaging devices.

2. Description of the Related Art

Solid state imaging devices are widely used for digital still cameras, digital video cameras, and the like. Known examples of the image sensor include MOS such as complementary metal oxide semiconductor (CMOS) image sensors, and charge coupled device (CCD) image sensors. In recent years, CMOS image sensors, having low power supply voltage, are widely used as solid state imaging devices mounted on mobile devices such as camera-equipped cell phones and smartphones in view of power consumption. Japanese Unexamined Patent Application Publication No. H05-48980 discloses an imaging device having microlenses.

SUMMARY

Imaging devices having high sensitivity to incident light and high light resistance are desired.

One non-limiting and exemplary embodiment provides the following device.

In one general aspect, the techniques disclosed here feature an imaging device including: a semiconductor substrate having a first surface and a second surface opposite to the first surface; a microlens located closer to the first surface than to the second surface; and a first photoelectric converter located between the first surface and the microlens. The first photoelectric converter includes a first electrode, a second electrode, and a photoelectric conversion layer that is located between the first electrode and the second electrode and that converts light into electric charges. The first photoelectric converter is the closest of any photoelectric converter existing between the first surface and the microlens to the first surface, the imaging device comprises no photodiode as a photoelectric converter, and a focal point of the microlens is located below a lowermost surface of the photoelectric conversion layer.

A general or specific aspect may be embodied by an element, device, module, system, integrated circuit, or method. Further, a general or specific aspect may be embodied by any combination of an element, device, module, system, integrated circuit, and method.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

Underlying Knowledge Forming Basis of the Present Disclosure

Figure 1:
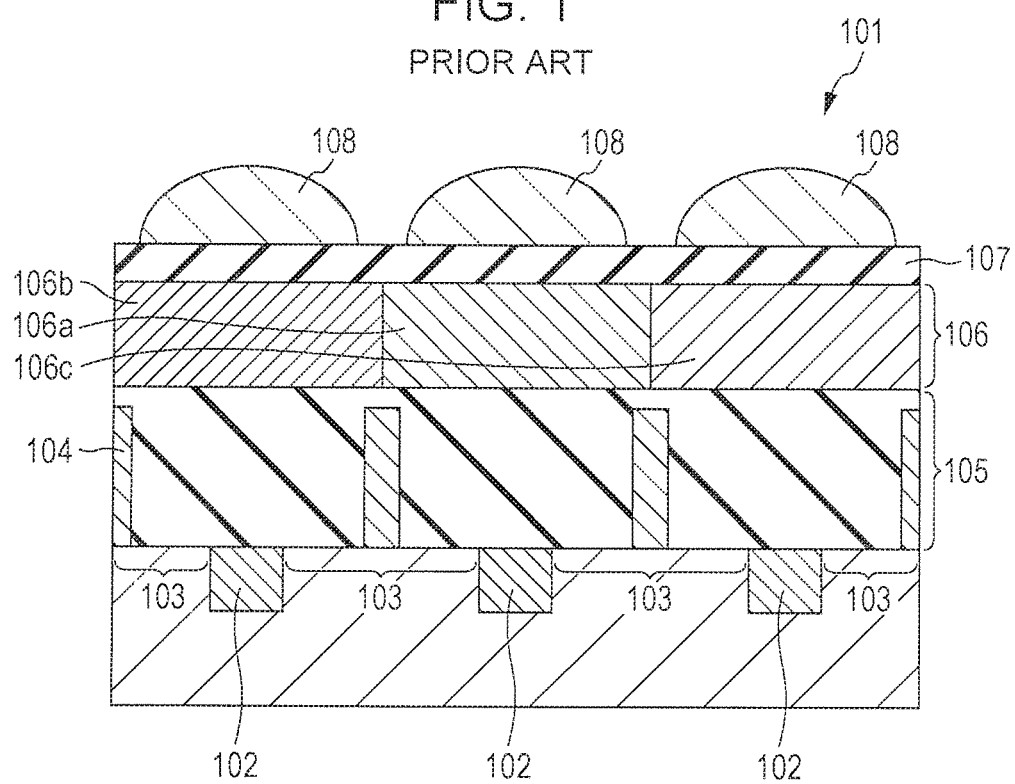
FIG. 1 is a schematic sectional view of an imaging device according to a reference example.

In image sensors, light sensitivity is of importance. In order to improve light sensitivity, microlenses are typically used. FIG. 1 is a schematic sectional view of an image sensor 101 according to a reference example on which microlenses are mounted. In the image sensor 101, a light-shielding layer 104 is formed in an insulating interlayer 105 so as to prevent light incident on a region 103, which is a region other than a light-receiving element 102. On the insulating interlayer 105, a color filter layer 106, which includes color filters 106a, 106b, and 106c, is disposed. On the color filter layer 106, a protective insulating film 107 having a planarized upper surface is disposed in order to improve planarization or light transmittance. On the protective insulating film 107, microlenses 108 for converging light are disposed.

Typically, the light-receiving element 102 is, for example, photogate or photodiode. The light-shielding layer 104 is made of a material such as metal. The microlens 108 is made of a material such as polymeric resin. The protective insulating film 107 is made of a material such as a silicon oxide based thin film, and typically has the same refractive index as that of the microlens. The microlens 108 is typically convex on one surface and planarized on the other surface. In the image sensor 101 of the reference example, the microlens 108 is convex on the upper surface, and planarized on the lower surface that is in contact with the protective insulating film 107. That is, the microlens 108 of the reference example is a convex lens having a convex shape only on the upper surface. Further, in the image sensor 101 of the reference example, the microlens 108 and the protective insulating film 107 have approximately the same refractive index. Moreover, in the image sensor 101 of the reference example, the convex lens is designed to have a focal distance which is the same as the distance from the convex lens to the light-receiving element. Accordingly, incident light can be efficiently focused on the light-receiving element 102. Japanese Unexamined Patent Application Publication No. H05-48980 discloses an imaging device in which the microlens is designed to have a focal distance which is equal to or less than a distance between the microlens and the photodiode.

However, in the case of stacked type imaging device which uses an organic thin film as a light-receiving element, it is not always suitable to have the focal distance of the microlens which is substantially equal to the distance between the microlens and the light-receiving element.

For example, when strong light such as sunlight is incident on the microlens and focused to be incident on the light-receiving element, the light-receiving element may be damaged. Specifically, image quality of the imaging device may be decreased due to a decrease in light sensitivity or burn-in.

The present disclosure has been made in light of the above issue of light resistance, and it is desired to provide an imaging device having high light resistance as well as light sensitivity by designing an appropriate shape for the microlens.

An aspect of the present disclosure is summarized below.
[Item 1]
An Imaging Device Including:
a semiconductor substrate having a first surface;
a microlens located above the first surface of the semiconductor substrate; and
one or more photoelectric converters located between the first surface of the semiconductor substrate and the microlens, each of the one or more photoelectric converters including a first electrode, a second electrode located closer to the microlens than the first electrode is, and a photoelectric conversion layer that is located between the first electrode and the second electrode and that converts light into electric charges, wherein a focal point of the microlens is located below a lowermost surface of the photoelectric conversion layer of a first photoelectric converter, the first photoelectric converter being located closest to the first surface of the semiconductor substrate among the one or more photoelectric converters.
[Item 2]
The imaging device according to the item 1, wherein the focal point of the microlens is located between the lowermost surface of the photoelectric conversion layer of the first photoelectric converter and the first surface of the semiconductor substrate.
[Item 3]
The imaging device according to the item 1 or 2, further including a wiring layer located between the first surface of the semiconductor substrate and the photoelectric conversion layer of the first photoelectric converter, wherein the focal point of the microlens is overlapped with the wiring layer in a plan view.
[Item 4]
The imaging device according to any one of the items 1 to 3, further including a color filter located between the microlens and the one or more photoelectric converters.
[Item 5]
The imaging device according to any one of the items 1 to 4, wherein the one or more photoelectric converters include a second photoelectric converter located between the first photoelectric converter and the microlens.
[Item 6]
The imaging device according to any one of the items 1 to 4, wherein the photoelectric conversion layer includes an organic material.

Further, an aspect of the present disclosure is summarized below.

An imaging device according to an aspect of the present disclosure is an imaging device including a semiconductor substrate, and a plurality of pixels disposed on the semiconductor substrate, wherein each of the plurality of pixels includes an upper electrode that transmits light, a lower electrode located below the upper electrode, a photoelectric converter located between the upper electrode and the lower electrode and converting light into electric charge, a microlens located above the photoelectric converter, and a signal detecting section that outputs a signal corresponding to the electric charge, and, when a distance from the vertex of the microlens to the uppermost surface of the photoelectric conversion layer is defined as X and a distance from the vertex of the microlens to the focal point is defined as Y, the Y is larger than the X.

Thus, since the distance Y from the vertex of the microlens to the focal point and the distance X from the vertex of the microlens to the uppermost surface of the photoelectric conversion layer satisfy the relationship of Y>X, the incident light converged by the microlens and entering the photoelectric conversion layer with the highest light intensity can be reduced. Accordingly, optical damage, such as burn-in, to the photoelectric conversion layer can be reduced to thereby improve light resistance of the imaging device. Further, reduction in quantum efficiency can be suppressed.

For example, in the imaging device according to an aspect of the present disclosure, the focal point of the microlens may be located below the lowermost surface of the photoelectric conversion layer, and may be located above the uppermost surface of the semiconductor substrate.

With this configuration, the light with high light intensity is reduced or prevented from being converged on the uppermost surface of the photoelectric conversion layer to thereby reduce optical damage to the photoelectric conversion layer. Accordingly, light resistance of the imaging device can be improved, and reduction in quantum efficiency can be suppressed. Further, since the photoelectric conversion layer can receive incident light at a large area and perform photoelectric conversion, the photoelectric conversion efficiency can be improved. Further, since the incident light becomes less likely to reach the semiconductor substrate, occurrence of photoelectric conversion in the semiconductor substrate can be reduced. Accordingly, unnecessary electric charge becomes less likely to occur in the semiconductor substrate, and thus the noise can be reduced.

For example, in the imaging device according to an aspect of the present disclosure, a wiring layer may be disposed at a position of the focal point of the microlens.

With this configuration, incident light is scattered by the wiring layer, which causes the incident light to be less likely to reach the semiconductor substrate. Accordingly, occurrence of photoelectric conversion in the semiconductor substrate can be reduced.

With reference to the drawings, an embodiment of the present disclosure will be described in detail.

The embodiment described below includes a general or specific example. Numerical values, shapes, components, arrangement positions and connection forms of the components, steps, the order of steps, and the like specified in the embodiment described below are merely an example, and are not intended to limit the present disclosure. Among the components in the embodiment described below, components that are not recited in independent claims which show the highest concept are described as optional components. The drawings are not necessarily to scale. Throughout the drawings, configurations which are substantially the same are denoted by the same reference signs, and the duplicated description thereof may be omitted or simplified.

Embodiment

Figure 2:
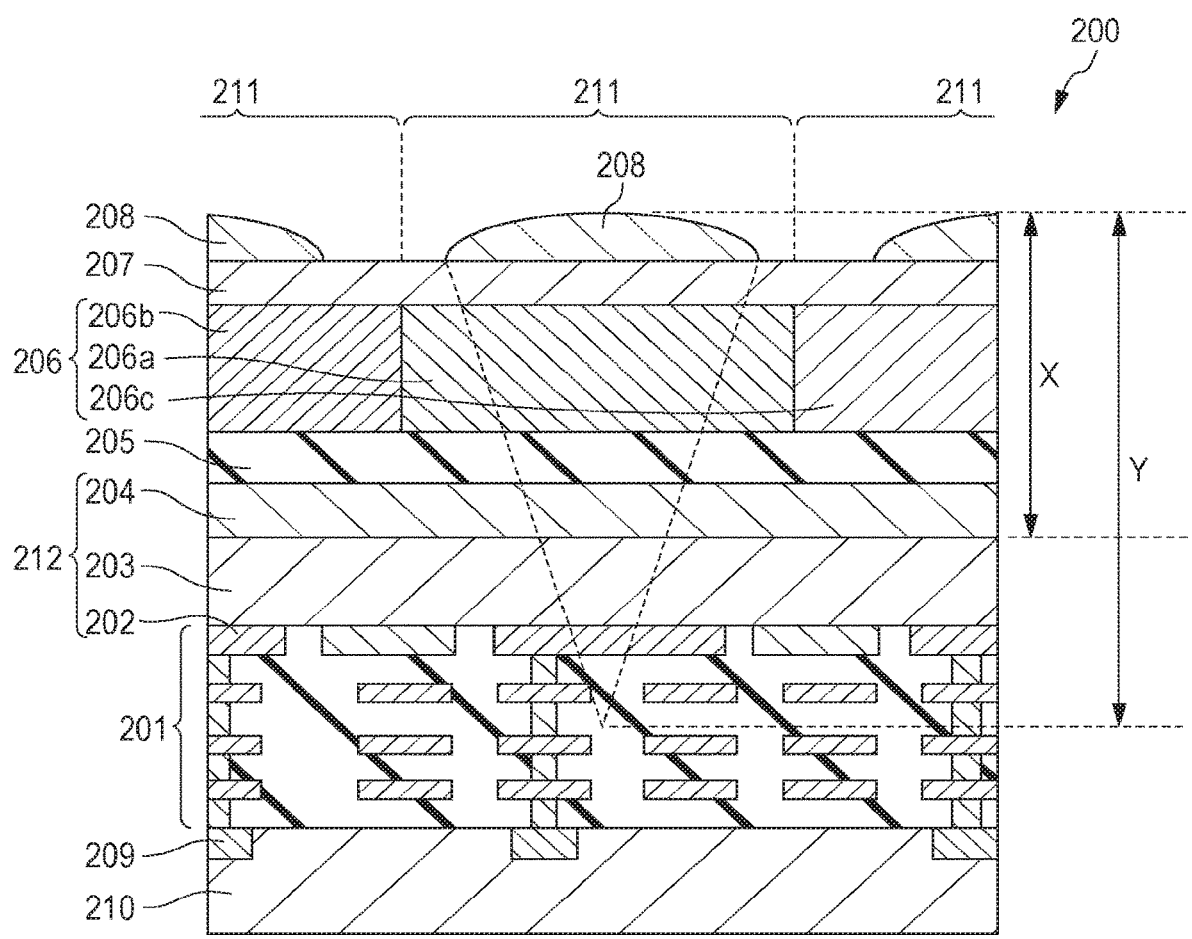
FIG. 2 is a schematic sectional view of an imaging device according to an embodiment.

FIG. 2 is a sectional view of an imaging device 200 according to the present embodiment.

The imaging device 200 according to the present embodiment is an imaging device which includes a semiconductor substrate 210, and a plurality of pixels 211 disposed over the semiconductor substrate 210. The plurality of pixels 211 each include a photoelectric converter 212, a microlens 208, and a signal detecting section 209. The photoelectric converter 212 includes an upper electrode 204 that transmits light, a lower electrode 202 located below the upper electrode 204, and a photoelectric conversion layer 203 located between the upper electrode 204 and the lower electrode 202 and converting light into electric charges. The microlens 208 is located above the photoelectric converter 212. The signal detecting section 209 outputs a signal corresponding to the electric charge obtained by the photoelectric converter 212.

Further, the imaging device 200 includes an insulating film 205 disposed on the upper electrode 204 of the photoelectric converter 212, a color filter layer 206 disposed on the insulating film 205, and a planarizing film 207 disposed on the color filter layer 206. The color filter layer 206 includes green color filters 206a, blue color filters 206b, and red color filters 206c. The color filters of the respective colors are arranged corresponding to the pixels 211 and according to Bayer pattern.

Further, the imaging device 200 includes an insulating interlayer 201 located below the photoelectric conversion layer 203, and a semiconductor substrate 210 located below the insulating interlayer 201. The semiconductor substrate 210 is provided with an electric charge accumulation region for accumulating electric charges, and a signal detecting section 209. The signal detecting section 209 is formed, for example, by combining a plurality of transistors such as CMOS transistors. For example, the signal detecting section 209 includes an amplifying transistor that outputs a signal corresponding to the electric charge accumulated in the electric charge accumulation region, and a reset transistor that resets the electric charge accumulation region. The gate of the amplifying transistor is connected to the electric charge accumulation region. The source or drain of the reset transistor is connected to the electric charge accumulation region. The electric charge accumulation region is connected to the lower electrode 202.

Further, the photoelectric conversion layer 203 may be made of an inorganic material or an organic material. The inorganic material may be, for example, amorphous silicon. When an organic material is used, an n-type organic semiconductor and a p-type organic semiconductor material may be joined.

In the following description, an example in which the photoelectric conversion layer 203 is made of an organic material will be described.

As illustrated in FIG. 2, a distance from the vertex of the microlens 208 to the uppermost surface of the photoelectric conversion layer 203 is defined as X, and a distance from the vertex of the microlens 208 to the focal point of the microlens is defined as Y. In the imaging device 200 according to the present embodiment, Y is larger than X. Since the distance Y from the vertex of the microlens to the focal point of the microlens is different from the distance X from the vertex of the microlens to the uppermost surface of the photoelectric conversion layer, the incident light converged by the microlens and entering the photoelectric conversion layer with the highest light intensity can be suppressed. Moreover, when Y>X is satisfied, light can be prevented from being converged at the center of pixels. Accordingly, optical damage, such as burn-in, to the photoelectric conversion layer can be suppressed to thereby improve light resistance of the imaging device. Further, reduction in quantum efficiency can be suppressed.

In the imaging device 200 according to the present embodiment, the position of the focal point of the microlens 208 may be located below the lowermost surface of the photoelectric conversion layer 203, or may be located above the uppermost surface of the semiconductor substrate 210. That is, the position of the focal point of the microlens 208 may be located between the lowermost surface of the photoelectric conversion layer 203 and the uppermost surface of the semiconductor substrate 210. Accordingly, the light with high light intensity converged inside the photoelectric conversion layer 203 can be suppressed or prevented to thereby suppress optical damage to the photoelectric conversion layer 203. In addition, the light resistance of the imaging device 200 can be improved, and thus reduction in the quantum efficiency can be suppressed. Further, since the photoelectric conversion layer 203 can receive incident light at a large area and perform photoelectric conversion, the photoelectric conversion efficiency can be improved. Further, since the incident light becomes less likely to reach the semiconductor substrate 210, occurrence of photoelectric conversion in the semiconductor substrate 210 can be suppressed. Accordingly, unnecessary electric charge is less likely to occur in the semiconductor substrate 210, and thus the noise can be suppressed.

In the imaging device 200 according to the present embodiment, a wiring layer may be disposed at a position of the focal point of the microlens 208. When a wiring layer is positioned in the insulating interlayer 201, incident light is scattered by the wiring layer, which causes the incident light to be less likely to reach the semiconductor substrate. Accordingly, occurrence of photoelectric conversion in the semiconductor substrate 210 can be reduced. The focal point of the microlens 208 may be overlapped with the wiring layer in plan view. In this configuration as well, the incident light becomes less likely to reach the semiconductor substrate 210.

In general, a focal distance f of the microlens 208 is represented by the following formula (1):

$$f=\{n1/(n1-n0)\}R \quad (1)$$

In the formula (1), R is a radius of curvature of the microlens 208, n1 is a refractive index of a material of the microlens 208, and n0 is a refractive index of a medium that is in contact with the light-incident side of the microlens 208.

That is, the formula (1) represents the focal distance f of the microlens 208 when light is incident on the microlens 208 having the refractive index n1 and the radius of curvature R, from a medium (for example, an air layer) having the refractive index n0.

When the height of the microlens 208 is h and the radius of the bottom of the microlens 208 is r, the radius of curvature R of the microlens 208 is represented by the following formula (2):

$$R=(r^2+h^2)/2h \quad (2)$$

Figure 3A:
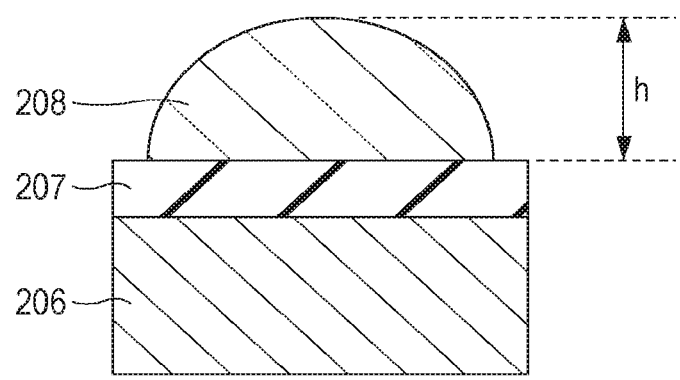
FIG. 3A and FIG. 3B are views which illustrate a height of a microlens and a gap between microlenses adjacent to each other in a diagonal direction, respectively.
Figure 3B:
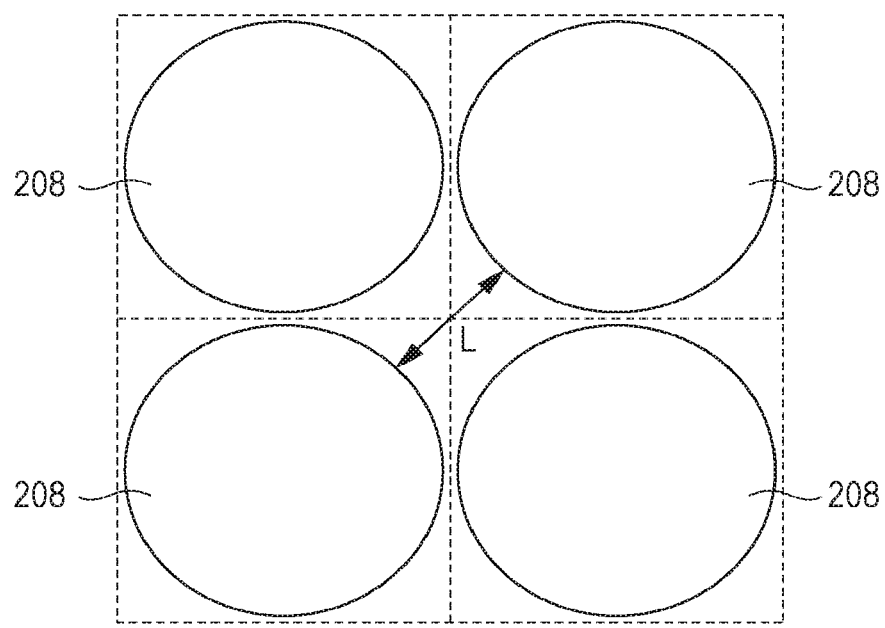

FIGS. 3A and 3B are views which illustrate a height h of the microlens 208 and a gap L between the microlenses 208 adjacent to each other in the diagonal direction. FIG. 3A is a schematic sectional view of the pixel 211. In the figure, a configuration below the color filter layer 206 is not illustrated. FIG. 3B is a plan view of four pixels 211.

As illustrated in FIG. 3A, the height h of the microlens 208 is a length from the bottom of the microlens 208 to the vertex of the microlens 208. Further, as illustrated in FIG. 3B, the gap L between the microlenses 208 adjacent to each other in the diagonal direction is a distance between the bottoms of two microlenses 208 adjacent to each other in the direction of a diagonal line of a pixel unit, which is composed of four pixels 211. A radius r of the bottom of the microlens 208 is determined depending on the size of the pixel 211 and the gap L.

In the following description, an optical simulation is described which is performed with the height h of the microlenses 208 being varied in the imaging device 200. The imaging device 200 includes the pixels 211 each having a square shape with a side length of 3.0 μm, and the microlenses the gap L of which is 800 nm between the microlenses 208 adjacent to each other in the direction of a diagonal line. Specifically, a wave optical simulation based on Babinet's principle is used. In every simulation described herein, the bottom of the microlens 208 has a circular shape in plan view, and the radius r of the bottom of the microlens 208 is calculated based on the size of the pixel 211 being 3.0 μm and the gap L between the microlenses 208 being 800 nm.

First, the above formulas (1) and (2) are used to obtain the focal distance f with respect to the height h of the microlens 208. The distance Y from the vertex of the microlens 208 to the focal point is calculated by adding a distance from the principal point to the vertex of the microlens to the focal distance f. In the formula (1), n0 is a refractive index of air (n0=1.0), and n1 is a refractive index of the microlens 208 (n1=1.6). The result of the simulation is shown in Table 1.

Table 1 shows the relationship, which depends on the height of the microlenses 208, between the distance Y from the vertex of the microlens 208 to the focal point and the distance X from the vertex of the microlens 208 to the uppermost surface of the photoelectric conversion layer 203. The X is a value in the case where a distance from the uppermost surface of the photoelectric conversion layer 203 to the uppermost surface of the planarizing film 207 is 1590 nm.

TABLE 1

| | Height h (nm) | | | | | | | |
|---|---|---|---|---|---|---|---|---|
| | 200 | 400 | 600 | 800 | 1000 | 1200 | 1400 | 1600 |
| Distance Y (nm) to focal point | 12512 | 6506 | 4615 | 3753 | 3302 | 3058 | 2930 | 2877 |
| Distance X (nm) to photoelectric conversion layer | 1790 | 1990 | 2190 | 2390 | 2590 | 2790 | 2990 | 3190 |

With reference to Table 1, when the side length of the pixel 211, the gap L of the microlenses 208 in the direction of diagonal line, and the height h of the microlens 208 are set as described above, the higher the height h of the microlens 208, the smaller the focal distance f of the microlens 208. That is, the higher the height h of the microlens 208, the smaller the distance Y from the vertex of the microlens 208 to the focal point. On the other hand, the higher the height h of the microlens 208, the larger the distance X from the vertex of the microlens 208 to the uppermost surface of the photoelectric conversion layer.

In the simulation, the focal point of the microlens 208 is also calculated. In the simulation, the thickness of the photoelectric conversion layer 203 is assumed as 500 nm, the thickness of the insulating interlayer 201 (that is, a distance from the lowermost surface of the photoelectric conversion layer 203 to the uppermost surface of the semiconductor substrate 210) is assumed as 3500 nm, and the thickness of the semiconductor substrate 210 is assumed as 775 nm. Here, the focal point of the microlens 208 at every height of the microlens 208 shown in Table 1 is as described below.

When the height of the microlens 208 is 200 nm, the focal point of the microlens 208 is located below the semiconductor substrate 210. When the height of the microlens 208 is 400 nm, the focal point of the microlens 208 is located in the semiconductor substrate 210. When the height of the microlens 208 is 600 nm, 800 nm, and 1000 nm, the focal point of the microlens 208 is located in the insulating interlayer 201. When the height of the microlens 208 is 1200 nm, the focal point of the microlens 208 is located in the photoelectric conversion layer 203. When the height of the microlens 208 is 1400 nm, the focal point of the microlens 208 is located in the insulating film 205 on the upper electrode 204. When the height of the microlens 208 is 1600 nm, the focal point of the microlens 208 is located above the upper electrode 204.

Specifically, a distance Z (nm) from the uppermost surface of the semiconductor substrate 210 to the focal point of the microlens 208 is represented as X+4000−Y (nm) when a direction from the semiconductor substrate 210 toward the microlens 208 is assumed as a positive direction. Accordingly, the relationship between the height h of the microlens 208 and the distance Z from the uppermost surface of the semiconductor substrate 210 to the focal point is as shown in Table 2. Here, the distance Z of 0 (nm) corresponds to the uppermost surface of the semiconductor substrate 210. The distance Z of 3500 (nm) corresponds to the lowermost surface of the photoelectric conversion layer 203. The distance Z of 4000 (nm) corresponds to the uppermost surface of the photoelectric conversion layer 203. Accordingly, when the height h of the microlens 208 is 200 nm and 400 nm, the focal point is located below the uppermost surface of the semiconductor substrate 210. When the height h of the microlens 208 is 600 nm, 800 nm, and 1000 nm, the focal point is located between the uppermost surface of the semiconductor substrate 210 and the lowermost surface of the photoelectric conversion layer 203. When the height h of the microlens 208 is 1200 nm, the focal point is located in the photoelectric conversion layer 203. When the height h of the microlens 208 is 1400 nm and 1600 nm, the focal point is located above the uppermost surface of the photoelectric conversion layer 203.

TABLE 2

| | Height h (nm) | | | | | | | |
|---|---|---|---|---|---|---|---|---|
| | 200 | 400 | 600 | 800 | 1000 | 1200 | 1400 | 1600 |
| Distance Y (nm) to focal point | 12512 | 6506 | 4615 | 3753 | 3302 | 3058 | 2930 | 2877 |
| Distance X (nm) to photoelectric conversion layer | 1790 | 1990 | 2190 | 2390 | 2590 | 2790 | 2990 | 3190 |
| Distance Z (nm) from semiconductor substrate surface to focal point | −6722 | −516 | 1575 | 2637 | 3288 | 3732 | 4060 | 4313 |

Next, a simulation on a light converging state is performed. In the simulation, the pixel has a square shape with a side length of 3.0 μm, and a gap L is 800 nm between the microlenses adjacent to each other in the direction of a diagonal line. Light is radiated onto the imaging device having these microlenses to check a light converging state on the uppermost surface of the photoelectric conversion layer, which depends on the height h of the microlens. The light used for the simulation has a wavelength of 530 nm. Hereinafter, a "square cell having a side length of x μm" is referred to as an "x μm cell".

Figure 4:
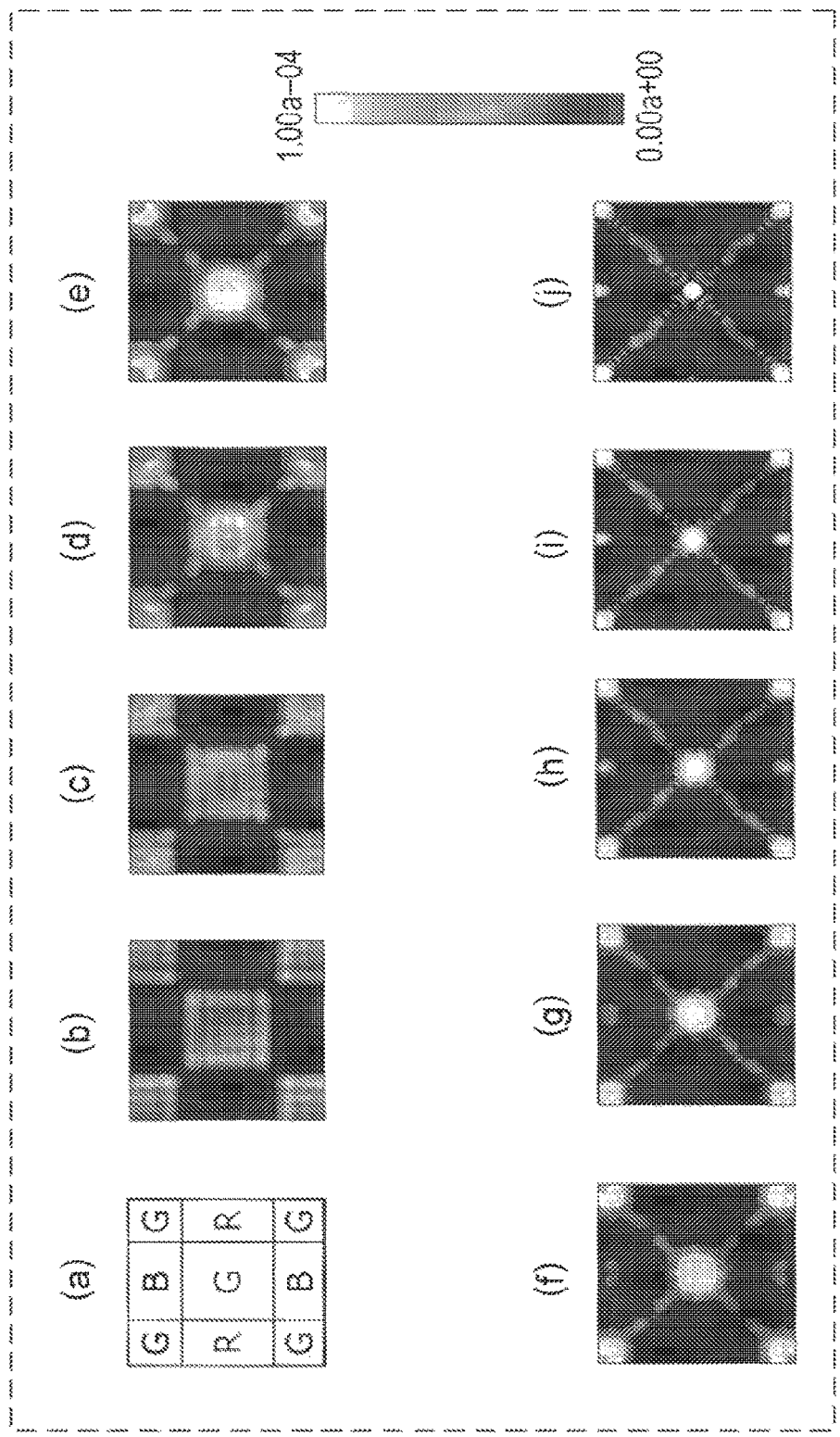
FIG. 4 is a view which shows the results of optical simulation.

FIG. 4 is a view which shows the results of optical simulation for the imaging device having a 3.0 μm cell. FIG. 4(a) is a schematic diagram of a pixel region (hereinafter, also referred to as an observation region) where a light converging state is observed. FIGS. 4(b) to 4(j) are views which show light intensity on the uppermost surface of the photoelectric conversion layer. In these views, a black part represents low light intensity, and a white part represents high light intensity.

As illustrated in FIG. 4(a), green color filters (G), blue color filters (B), and red color filters (R) are arranged corresponding to the respective pixels and according to Bayer pattern, and the observation region includes the green pixel and part of the peripheral pixels.

FIGS. 4(b), 4(c), 4(d), 4(e), 4(f), 4(g), 4(h), 4(i), and 4(j) show the light converging state when the height h of the microlens is 0 nm (i.e., without microlens), 200 nm, 400 nm, 600 nm, 800 nm, 1000 nm, 1200 nm, 1400 nm, and 1600 nm, respectively.

As shown in FIGS. 4(b) to 4(j), the higher the height h of the microlens, the smaller the distance Y from the vertex of the microlens to the focal point. Light incident on the microlens is gradually converged to a point at the center of pixel in plan view.

Specifically, the lower the height h of the microlens, the larger the distance Y from the vertex of the microlens to the focal point (hereinafter, simply referred to as "the distance Y to the focal point"). When the distance Y to the focal point becomes larger than the distance X from the vertex of the microlens to the uppermost surface of the photoelectric conversion layer (hereinafter, simply referred to as "the distance X to the photoelectric conversion layer"), the focal point of the microlens moves to a position below the uppermost surface of the photoelectric conversion layer. Accordingly, a degree of light concentration on the uppermost surface of the photoelectric conversion layer decreases. The degree of light concentration refers to an integrated value of light intensity per unit area in the center part of pixel in plan view.

On the other hand, when the height h of the microlens increases, the distance Y to the focal point decreases and becomes closer to the distance X to the photoelectric conversion layer. That is, as the height h of the microlens increases, the focal point of the microlens becomes closer to the uppermost surface of the photoelectric conversion layer and thus the degree of light concentration on the uppermost surface of the photoelectric conversion layer increases.

Next, a simulation is performed on the relationship between the height h of the microlens and the degree of light concentration on the uppermost surface of the photoelectric conversion layer. The result is described below. Further, an image sensor is prototyped with the height h of the microlens being varied to evaluate the relationship between the height h of the microlens and the reduction in quantum efficiency. The result is described below.

Figure 6:
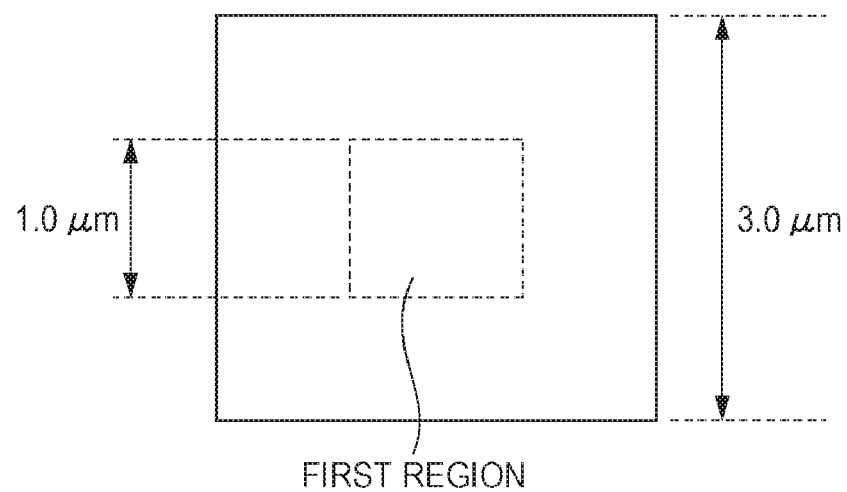
FIG. 6 is a view which illustrates a degree of light concentration in a first region.

In the following description, as illustrated in FIG. 6, a "first region" refers to a region in the center part of the 3.0 μm cell, and the region has a square shape with a side length of 1.0 μm. The degree of light concentration in the first region refers to an integrated value of light intensity in the first region. A "normalized degree of light concentration" refers to a normalized value of degree of light concentration in the first region for each height h of the microlens on the assumption that the degree of light concentration in the first region is 1 when a microlens is not provided, that is, when the height h of the microlens is 0 nm. The "quantum efficiency" refers to a ratio of the amount of light absorbed by the photoelectric conversion layer to the amount of incident light. The "quantum efficiency reduction rate" refers to a difference between the quantum efficiency before light radiation and the quantum efficiency after radiation of light at 100,000 lux for 150 hours. The "normalized quantum efficiency reduction rate" refers to a normalized value of quantum efficiency reduction rate for each height h of the microlens on the assumption that the quantum efficiency reduction rate is 1 when the height h of the microlens is 1400 nm.

Figure 5:
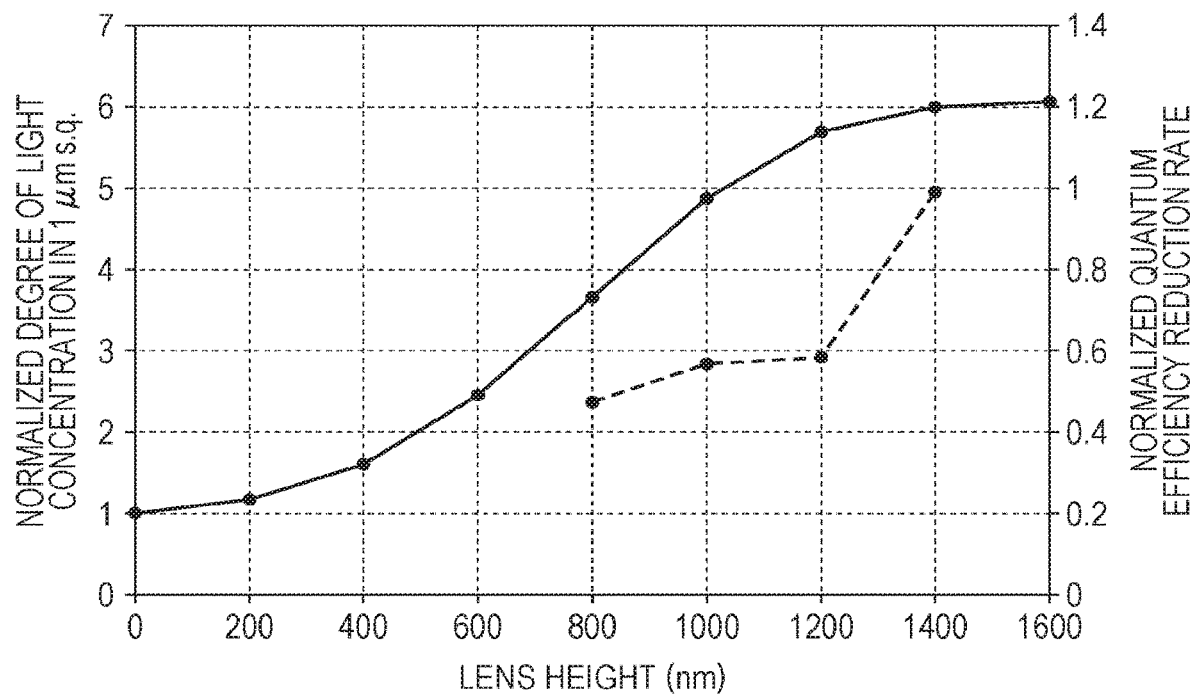
FIG. 5 is a graph that represents the relationship between the height of the microlens and a normalized degree of light concentration, and the relationship between the height of the microlens and the normalized quantum efficiency reduction rate.

FIG. 5 is a graph that represents the relationship between the height h of the microlens and the normalized degree of light concentration in the first region, and the relationship between the height h of the microlens and the normalized quantum efficiency reduction rate. In FIG. 5, the solid line represents the result of the normalized degree of light concentration for each height h of the microlens obtained from a simulation. The dotted line represents the result of the normalized quantum efficiency reduction rate obtained from an experiment.

As seen from the graph indicated by the solid line in FIG. 5, light is more likely to be converged at the center of pixel in plan view with an increase in the height h of the microlens. In particular, it is found that an increase rate in the normalized degree of light concentration is large when the height h of the microlens is in the range from approximately 600 nm to approximately 1200 nm. Further, as seen from the graph indicated by the dotted line in FIG. 5, the quantum efficiency is more likely to decrease after light radiation with an increase in the height h of the microlens. Accordingly, it seems that, since light is more likely to be converged at the center of pixel in plan view with an increase in the height h of the microlens, deterioration of the photoelectric conversion layer is more likely to occur at around the center of the pixel, leading to a decrease in quantum efficiency.

In other words, as the distance Y from the vertex of the microlens to the focal point becomes larger than the distance X from the vertex of the microlens to the uppermost surface of the photoelectric conversion layer, the degree of light concentration at the center of pixel in plan view decreases. Accordingly, the quantum efficiency is less likely to decrease after light radiation.

Therefore, when the relationship Y>X is satisfied, light can be prevented from being converged at the center of pixels, and thus the photoelectric conversion layer can be prevented from receiving optical damage such as burn-in. Accordingly, light resistance of the imaging device can be improved, and reduction in quantum efficiency can be suppressed.

Figure 7:
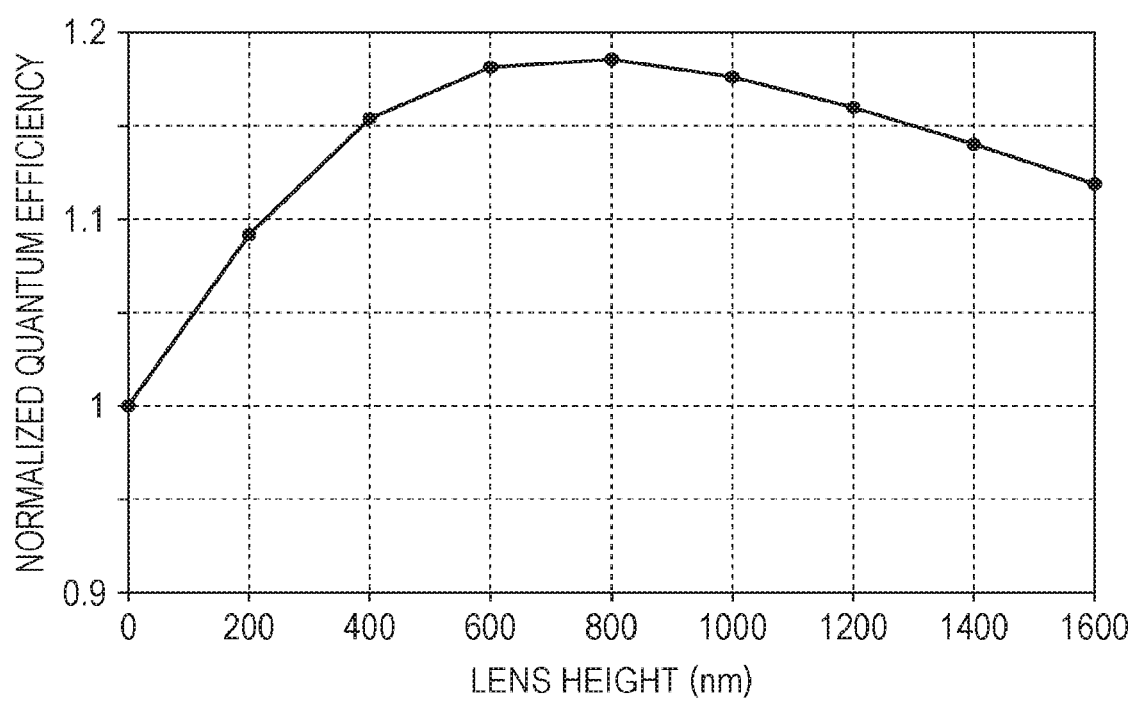
FIG. 7 is a graph that illustrates the result of simulation on the relationship between the height of the microlens and a normalized quantum efficiency.

Then, a simulation is performed on the relationship between the height h of the microlens and the quantum efficiency. In the simulation, an imaging device having a configuration illustrated in FIG. 2 is used. FIG. 7 is a graph that represents the result of simulation performed on the relationship between the height h of the microlens and the normalized quantum efficiency.

The "normalized quantum efficiency" refers to a normalized value of quantum efficiency for each height h of the microlens on the assumption that the quantum efficiency is 1 when a microlens is not provided, that is, when the height h of the microlens is 0 nm.

As illustrated in the graph in FIG. 7, in the imaging device having a configuration illustrated in FIG. 2, the quantum efficiency becomes maximum when the height h of the microlens is in the range from approximately 600 nm to approximately 800 nm.

Figure 8:
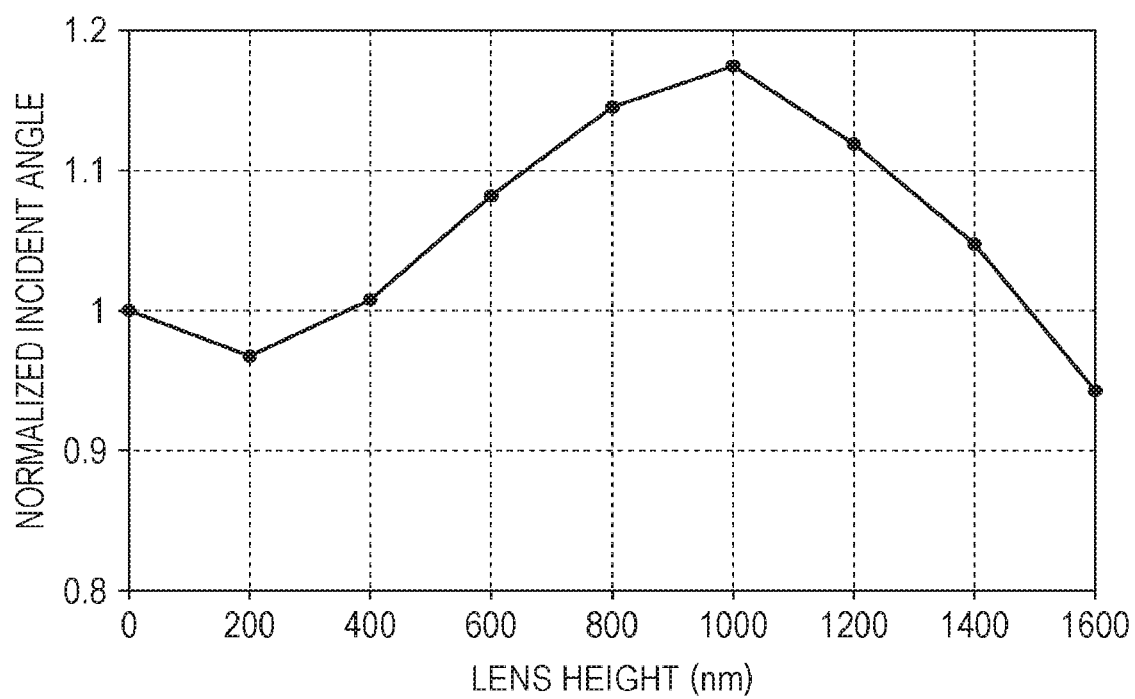
FIG. 8 is a graph that illustrates the result of simulation on the relationship between the height of the microlens and a normalized effective incident angle.

Subsequently, a simulation is performed on the relationship between the height h of the microlens and the light converging characteristics of the microlens. In this simulation as well, an imaging device having the same configuration as that in the simulation of normalized quantum efficiency is used. FIG. 8 is a diagram that represents the result of simulation performed on the relationship between the height h of the microlens and the normalized effective incident angle.

The "effective incident angle" refers to an incident angle of light when the quantum efficiency is 0.8 on the assumption that the quantum efficiency of the light incident on a G (green) pixel at 0° (that is, vertically) is 1 when light having a wavelength of 530 nm is radiated onto the G pixel corresponding to the green color filter. The "normalized effective incident angle" refers to a normalized value of effective incident angle for each height h of the microlens on the assumption that the effective incident angle is 1 when the height h of the microlens is 0 nm. The graph in FIG. 8 illustrates that, as the normalized effective incident angle increases, light in wider range of incident angle can be converged by the microlens and used for photoelectric conversion.

As seen from the graph in FIG. 8, in the imaging device having a configuration illustrated in FIG. 2, the effective incident angle is high when the height h of the microlens is in the range from approximately 800 nm to approximately 1200 nm. In particular, it is found that the effective incident angle is maximum when the height of the microlens is approximately 1000 nm.

From the results of simulation as described above, when the height h of the microlens is 1400 nm, the relationship between the distance Y to the focal point and the distance X to the photoelectric conversion layer is Y≈X (Y<X), and the focal point of the microlens is located slightly above the uppermost surface of the photoelectric conversion layer, that is, located in the upper electrode. Here, as seen from FIG. 4(i) and the graph indicated by the solid line in FIG. 5, the light intensity on the uppermost surface of the photoelectric conversion layer is high, and the degree of light concentration is also high. However, as indicated by the dotted line in FIG. 5, the quantum efficiency reduction after light radiation is the highest when the height h of the microlens is 1400 nm.

When the height h of the microlens is 1000 nm, 800 nm, and 600 nm, Y>X is satisfied. When the height h of the microlens is 1000 nm, the focal point of the microlens is located in the lower electrode. Further, when the height h of the microlens is 800 nm and 600 nm, the focal point of the microlens is located in the insulating interlayer. In addition, a wiring layer is disposed in the insulating interlayer. As indicated by the dotted line in FIG. 5, when the relationship between the distance Y to the focal point and the distance X to the photoelectric conversion layer satisfies Y>X, and the focal point of the microlens is located below the uppermost surface of the photoelectric conversion layer and above the uppermost surface of the semiconductor substrate, deterioration after light radiation can be suppressed. Further, as illustrated in FIGS. 7 and 8, when the height h of the microlens is in the range from 600 nm to 1200 nm, the quantum efficiency and the effective incident angle are improved.

According to the present disclosure, in the stacked type solid state imaging device, light converging efficiency and light resistance can be improved by setting the focal point of the microlens at a position below the uppermost surface of the photoelectric conversion layer. Further, light converging efficiency and light resistance can be improved by setting the focal point of the microlens at a position below the lowermost surface of the photoelectric conversion layer and above the semiconductor substrate. The microlens of the present disclosure can be implemented, for example, by modifying a coating thickness and a light exposure amount in production of microlens by using a conventional process and material.

As described above, since the imaging device of the present disclosure can mitigate the degree of light concentration to the photoelectric conversion layer without reducing quantum efficiency, optical damage to the photoelectric conversion layer can be reduced.

As described above, the relationship between the height h of the microlens and the distance Z from the uppermost surface of the semiconductor substrate to the focal point of the microlens is shown in Table 2. Accordingly, the graphs illustrated in FIGS. 5, 7, and 8 can also be represented with a horizontal axis representing the distance Z from the uppermost surface of the semiconductor substrate to the focal point. Here, the description will be made based on the graph having the horizontal axis representing the distance Z.

Figure 9:
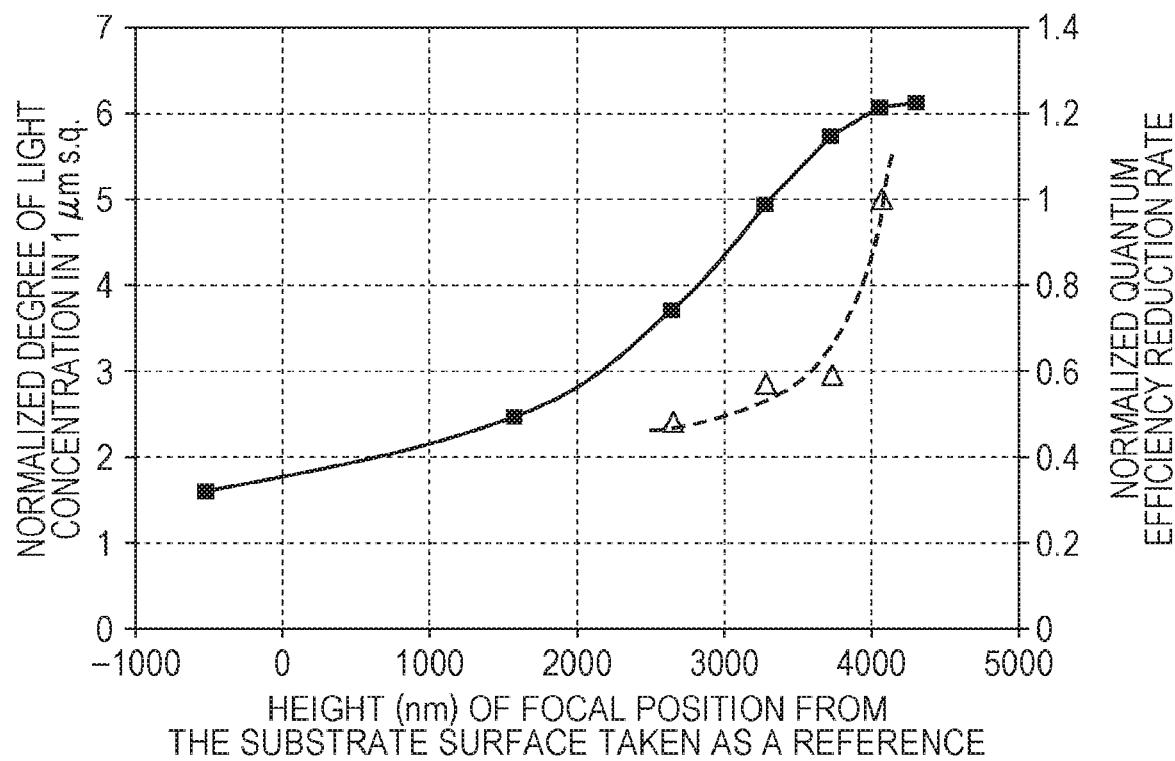
FIG. 9 is a graph that represents the relationship between a distance from an uppermost surface of a semiconductor substrate to a focal point and the normalized degree of light concentration, and the relationship between the distance from the uppermost surface of the semiconductor substrate to the focal point and the normalized quantum efficiency reduction rate.
Figure 10:
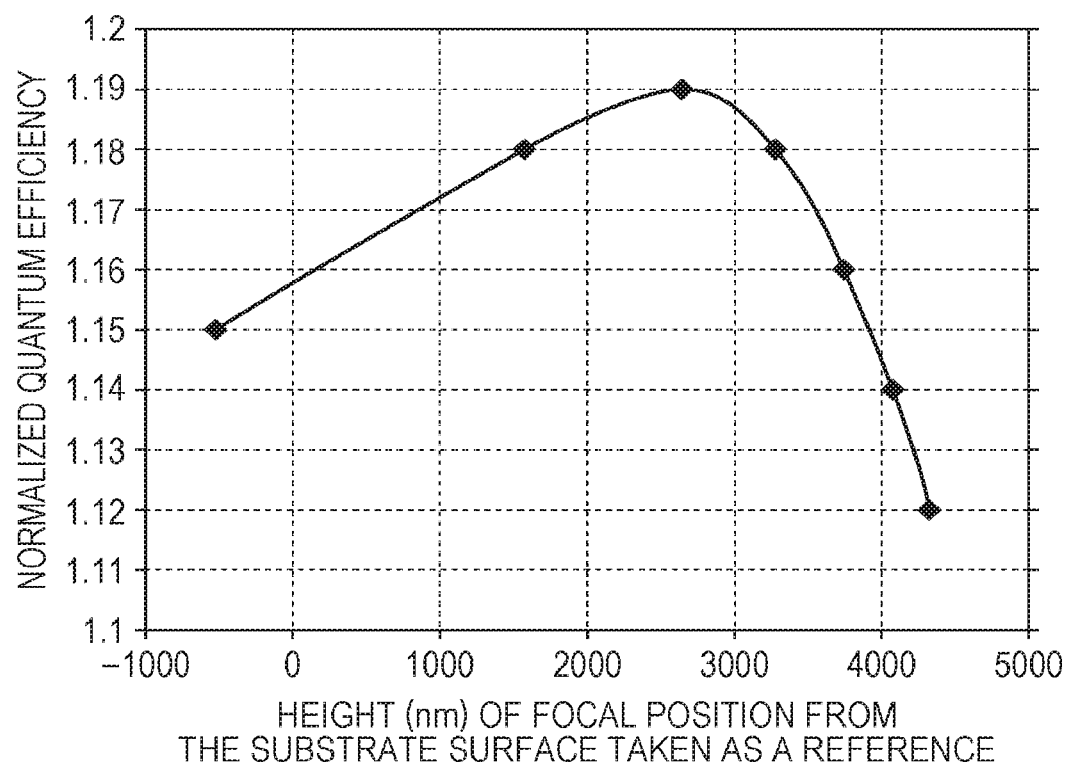
FIG. 10 is a graph that illustrates the result of simulation on the relationship between the distance from the uppermost surface of the semiconductor substrate to the focal point and the normalized quantum efficiency.
Figure 11:
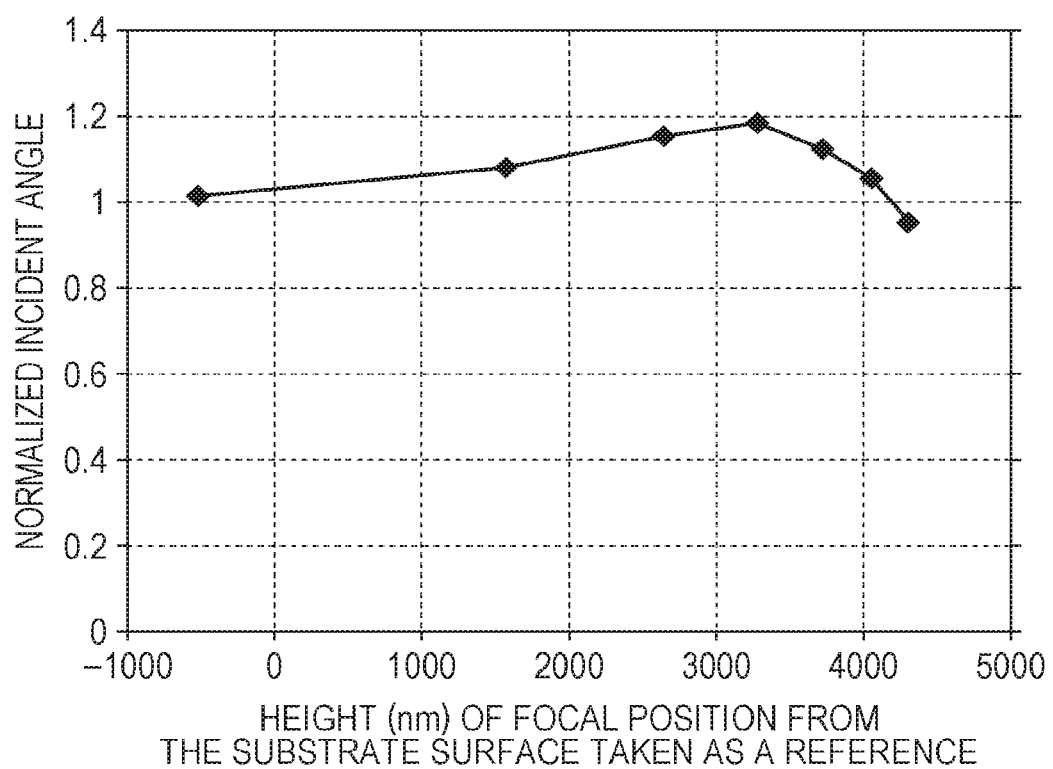
FIG. 11 is a graph that illustrates the result of simulation on the relationship between the distance from the uppermost surface of the semiconductor substrate to the focal point and the normalized effective incident angle.

FIG. 9, which corresponds to FIG. 5, represents the relationship between the distance Z from the uppermost surface of the semiconductor substrate to the focal point and the normalized degree of light concentration, and the relationship between the distance Z from the uppermost surface of the semiconductor substrate to the focal point and the normalized quantum efficiency reduction rate. FIG. 10, which corresponds to FIG. 7, represents the relationship between the distance Z from the uppermost surface of the semiconductor substrate to the focal point and the normalized quantum efficiency. FIG. 11, which corresponds to FIG. 8, represents the relationship between the distance Z from the uppermost surface of the semiconductor substrate to the focal point and the normalized effective incident angle. In the respective drawings, The distance Z of 0 (nm) corresponds to the uppermost surface of the semiconductor substrate 210. The distance Z of 3500 (nm) corresponds to the lowermost surface of the photoelectric conversion layer 203. The distance Z of 4000 (nm) corresponds to the uppermost surface of the photoelectric conversion layer 203.

As illustrated in FIG. 9, when the focal point is located below the lowermost surface of the photoelectric conversion layer (i.e., Z<3500), the normalized degree of light concentration decreases and thus the normalized quantum efficiency reduction rate decreases. That is, durability can be improved by setting the focal point to be located below the lowermost surface of the photoelectric conversion layer. Further, as illustrated in FIG. 10, when the focal point is located below the lowermost surface of the photoelectric conversion layer (i.e., Z<3500), the normalized quantum efficiency is high. Thus, durability as well as sensitivity can be improved by setting the focal point to be located below the lowermost surface of the photoelectric conversion layer. Further, as illustrated in FIG. 11, when the focal point is located below the lowermost surface of the photoelectric conversion layer (i.e., Z<3500), the normalized effective incident angle is large. That is, light in a wider range of incident angle can be converged and used for photoelectric conversion by setting the focal point to be located below the lowermost surface of the photoelectric conversion layer.

The imaging device according to the present disclosure has been described with reference to the embodiment. However, the present disclosure is not limited to the above embodiment. It should be noted that, without deviating from the spirit of the present disclosure, another embodiment formed by applying various modification conceived by a person having ordinary skill in the art to the above embodiment, or by combining part of components of the above embodiment is also included in the scope of the present disclosure. A modified example of the present embodiment will be described below.

Figure 12:
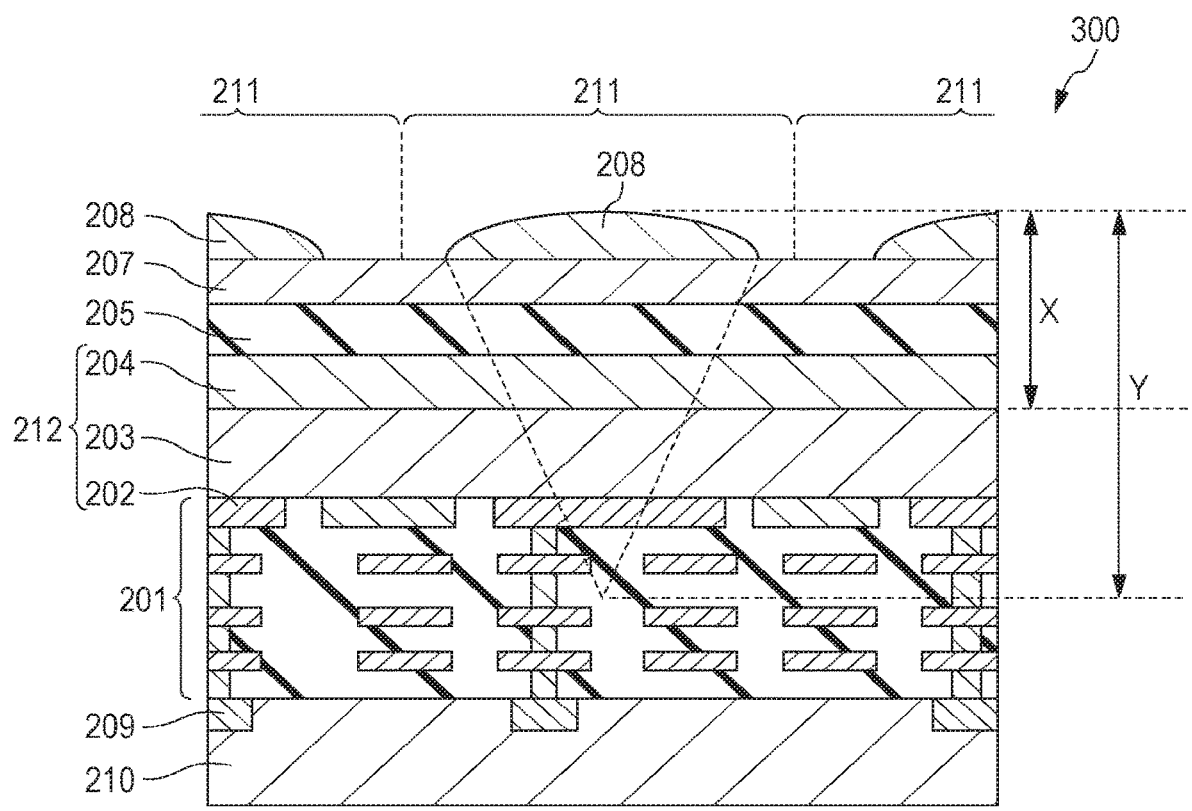
FIG. 12 is a schematic sectional view of an imaging device according to a modified example of an embodiment.

The imaging device 200 illustrated in FIG. 2 includes the color filter layer 206 between the photoelectric converter 212 and the microlens 208. However, the color filter layer 206 may not be necessarily provided. FIG. 12 is a schematic sectional view of an imaging device according to a modified example. An imaging device 300 illustrated in FIG. 12 is different from the imaging device 200 illustrated in FIG. 2 in that the planarizing film 207 is formed directly on the insulating film 205. In the configuration of the imaging device 300 illustrated in FIG. 12 as well, the focal point of the microlens 208 may be set to be located between the uppermost surface of the semiconductor substrate 210 and the lowermost surface of the photoelectric conversion layer 203. With this configuration, the same effect as that described for the imaging device 200 illustrated in FIG. 2 can be obtained.

Figure 13:
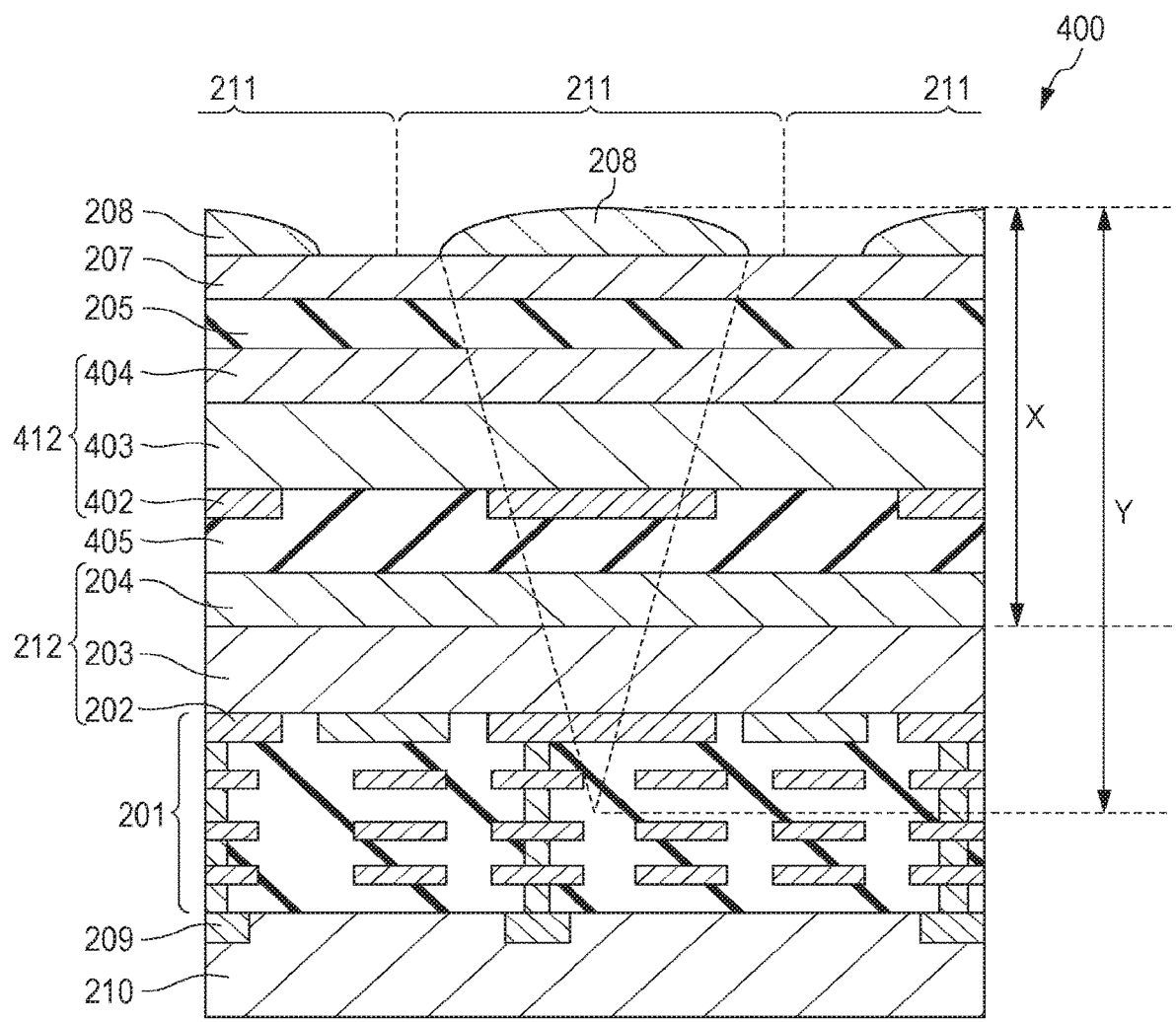
FIG. 13 is a schematic sectional view of an imaging device according to another modified example of an embodiment.

Further, the imaging device 200 illustrated in FIG. 2 includes only one photoelectric converter 212 between the semiconductor substrate 210 and the microlens 208. However, a plurality of photoelectric converters may be provided between the semiconductor substrate 210 and the microlens 208. FIG. 13 is a schematic sectional view of an imaging device according to another modified example. An imaging device 400 illustrated in FIG. 13 is different from the imaging device 200 illustrated in FIG. 2 in that an insulating film 405 and a photoelectric converter 412 are provided between the photoelectric converter 212 and the insulating film 205. In the imaging device 400 illustrated in FIG. 13, the focal point of the microlens 208 may be set to be located between the uppermost surface of the semiconductor substrate 210 and the lowermost surface of the photoelectric conversion layer 203 and between the uppermost surface of the semiconductor substrate 210 and the lowermost surface of the photoelectric conversion layer 403. That is, the focal point of the microlens 208 may be set to be located between the uppermost surface of the semiconductor substrate 210 and the lowermost surface of the photoelectric conversion layer 203 which is closest to the semiconductor substrate 210. With this configuration, the same effect as that described for the imaging device 200 illustrated in FIG. 2 can be obtained for each of the photoelectric conversion layer 203 and the photoelectric conversion layer 403. In addition, in the configuration having layers of three or more photoelectric converters, the same effect can be obtained by employing the similar configuration.

The imaging device of the present disclosure can be applied to cameras such as digital cameras and vehicle-mounted cameras.

What is claimed is:

1. An imaging device comprising:
   a semiconductor substrate having a first surface and a second surface opposite to the first surface;
   a microlens located closer to the first surface than to the second surface; and
   a first photoelectric converter located between the first surface and the microlens, the first photoelectric converter including a first electrode, a second electrode, and a photoelectric conversion layer that is located between the first electrode and the second electrode and that converts light into electric charges, wherein
   the first photoelectric converter is the closest of any photoelectric converter existing between the first surface and the microlens to the first surface,
   the imaging device comprises no photodiode as a photoelectric converter, and
   a focal point of the microlens is located below a lowermost surface of the photoelectric conversion layer.

2. The imaging device according to claim 1, further comprising
   a wiring layer located between the first surface of the semiconductor substrate and the photoelectric conversion layer of the first photoelectric converter, wherein
   the focal point of the microlens is overlapped with the wiring layer in a plan view.

3. The imaging device according to claim 1, further comprising a color filter located between the microlens and the first photoelectric converter.

4. The imaging device according to claim 1, further comprising a second photoelectric converter located between the first photoelectric converter and the microlens.

5. The imaging device according to claim 1, wherein the photoelectric conversion layer includes an organic material.

6. The imaging device according to claim 1, further comprising
a signal detecting circuit that detects the electric charges from the first photoelectric converter, wherein
the first electrode is located between the photoelectric conversion layer and the semiconductor substrate,
the focal point of the microlens overlaps with the first electrode in a plan view,
the focal point of the microlens is located above the signal detecting circuit.

7. The imaging device according to claim 6, wherein the focal point of the microlens is located above the first surface of the semiconductor substrate.

8. An imaging device comprising:
a semiconductor substrate having a first surface and a second surface opposite to the first surface;
a microlens located closer to the first surface than to the second surface; and
at least one photoelectric converter located between the first surface and the microlens, each of the at least one photoelectric converter including a first electrode, a second electrode, and a photoelectric conversion layer that is located between the first electrode and the second electrode and that converts light into electric charges, wherein
the at least one photoelectric converter includes a first photoelectric converter that is the closest of any photoelectric converter existing between the first surface and the microlens to the first surface,
the imaging device comprises only the at least one photoelectric converter as a photoelectric converter, and
a focal point of the microlens is located below a lowermost surface of the photoelectric conversion layer.

9. The imaging device according to claim 8, further comprising
a wiring layer located between the first surface of the semiconductor substrate and the photoelectric conversion layer of the first photoelectric converter, wherein
the focal point of the microlens is overlapped with the wiring layer in a plan view.

10. The imaging device according to claim 8, further comprising a color filter located between the microlens and the first photoelectric converter.

11. The imaging device according to claim 8, further comprising a second photoelectric converter located between the first photoelectric converter and the microlens.

12. The imaging device according to claim 8, wherein the photoelectric conversion layer includes an organic material.

13. The imaging device according to claim 8, further comprising
a signal detecting circuit that detects the electric charges from the first photoelectric converter, wherein
the first electrode is located between the photoelectric conversion layer and the semiconductor substrate,
the focal point of the microlens overlaps with the first electrode in a plan view,
the focal point of the microlens is located above the signal detecting circuit.

14. The imaging device according to claim 13, wherein the focal point of the microlens is located above the first surface of the semiconductor substrate.

* * * * *